United States Patent
Stebani et al.

(10) Patent No.: US 10,953,648 B2
(45) Date of Patent: Mar. 23, 2021

(54) METHOD FOR PRODUCING CYLINDRICAL FLEXO PRINTING ELEMENTS

(71) Applicant: Flint Group Germany GmbH, Stuttgart (DE)

(72) Inventors: Uwe Stebani, Flörsheim-Dalsheim (DE); Joelle Bedat, Offendorf (FR); Armin Becker, Großniedesheim (DE); Alfred Leinenbach, Oberkirch-Nußbach (DE); Claudia May, Willstätt (DE); Christian Arnold, Kehl Goldscheuer (DE); Josef Rothen, Solingen (DE)

(73) Assignee: Flint Group Germany GmbH

( * ) Notice: Subject to any disclaimer, the term of this patent is extended or adjusted under 35 U.S.C. 154(b) by 535 days.

(21) Appl. No.: 14/897,839

(22) PCT Filed: Jun. 12, 2014

(86) PCT No.: PCT/EP2014/062195
§ 371 (c)(1),
(2) Date: Dec. 11, 2015

(87) PCT Pub. No.: WO2014/198810
PCT Pub. Date: Dec. 18, 2014

(65) Prior Publication Data
US 2016/0136942 A1 May 19, 2016

(30) Foreign Application Priority Data
Jun. 14, 2013 (EP) .................................... 13172045

(51) Int. Cl.
*B41C 1/00* (2006.01)
*G03F 7/18* (2006.01)
(Continued)

(52) U.S. Cl.
CPC ................ *B41C 1/00* (2013.01); *B05D 3/12* (2013.01); *B05D 7/58* (2013.01); *G03F 7/18* (2013.01); *B41C 1/05* (2013.01); *B41N 1/22* (2013.01)

(58) Field of Classification Search
CPC .... B41C 1/00; B41C 1/05; B05D 3/12; B05D 7/58; G03F 7/18; B41N 1/22
See application file for complete search history.

(56) References Cited

U.S. PATENT DOCUMENTS

| 5,049,478 A | 9/1991 | Koch et al. |
| 5,798,019 A | 8/1998 | Cushner et al. |

(Continued)

FOREIGN PATENT DOCUMENTS

| EP | 0084851 A2 | 8/1983 |
| EP | 0185337 A2 | 6/1986 |

(Continued)

OTHER PUBLICATIONS

International Search Report for PCT/EP2014/062195 dated Jul. 18, 2014.

*Primary Examiner* — Robert S Walters, Jr.
(74) *Attorney, Agent, or Firm* — Faegre Drinker Biddle & Reath LLP

(57) ABSTRACT

Methods for producing cylindrical flexographic printing elements, the cylindrical flexographic printing elements having a relief-forming layer, and the relief-forming layer being produced by successive application of a plurality of layers of a relief-forming material in liquid melt form, preferably of a photopolymerizable material in liquid melt form, to a rotating cylindrical sleeve in a continuous process.

18 Claims, 4 Drawing Sheets

Figure 1:
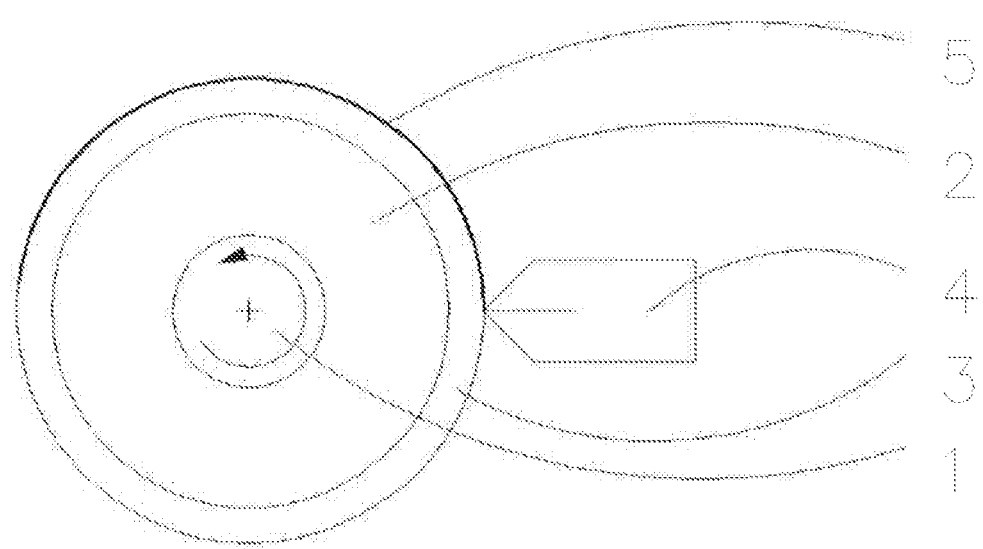

(51) Int. Cl.
  *B05D 3/12*  (2006.01)
  *B05D 7/00*  (2006.01)
  *B41N 1/22*  (2006.01)
  *B41C 1/05*  (2006.01)

(56) References Cited

U.S. PATENT DOCUMENTS

| | | | |
|---|---|---|---|
| 5,916,403 | A | 6/1999 | Cushner et al. |
| 6,425,327 | B1 | 7/2002 | Fan et al. |
| 7,709,183 | B2 | 5/2010 | Watanabe et al. |
| 2004/0067438 | A1 | 4/2004 | Fan et al. |
| 2006/0249239 | A1 | 11/2006 | Krauss et al. |
| 2009/0241788 | A1* | 10/2009 | Leenders ............... B05C 3/10 101/351.7 |
| 2010/0297558 | A1* | 11/2010 | Becker .................. B41C 1/05 430/285.1 |

FOREIGN PATENT DOCUMENTS

| | | |
|---|---|---|
| EP | 0362641 A2 | 4/1990 |
| EP | 654150 A1 | 5/1995 |
| EP | 1069475 A1 | 1/2001 |
| EP | 1076263 A2 | 2/2001 |
| EP | 1642715 A1 | 4/2006 |
| JP | H09169060 A | 6/1997 |
| JP | 2001109137 A | 4/2001 |
| JP | 2002079645 A | 3/2002 |
| JP | 2005219352 A | 8/2005 |
| WO | WO-94/03838 A1 | 2/1994 |
| WO | WO-2004/092841 A2 | 10/2004 |
| WO | WO-2005005147 A1 | 1/2005 |

* cited by examiner

METHOD FOR PRODUCING CYLINDRICAL FLEXO PRINTING ELEMENTS

CROSS-REFERENCE TO RELATED APPLICATIONS

This application is a national stage application (under 35 U.S.C. § 371) of CT/EP2014/062195, filed Jun. 12, 2014, which claims benefit of European Application No. 13172045.0, filed Jun. 14, 2013, both of which are incorporated herein by reference in their entirety.

The present invention relates to a method for producing cylindrical flexographic printing elements that can be utilized for producing cylindrical flexographic printing plates, the cylindrical flexographic printing elements having a relief-forming layer, and the relief-forming layer being produced by successive application of a plurality of layers of a relief-forming material in liquid melt form, preferably of a photopolymerizable material in liquid melt form, to a rotating cylindrical sleeve in a continuous process.

Flexographic printing plates may have a flat plate form or a cylinder form. For printing, flexographic printing plates are customarily adhered to the printing cylinder. Only part of the printing cylinder, therefore, is covered by the flexographic printing plate.

For economic reasons, target printing speeds are becoming ever greater. With increasing printing speed, when printing with plates, problems arise both with vibrations of the printing machine and with printing at the edges of the printing plates. Higher printing speeds, especially speeds of more than 300 m/min, therefore require cylindrical flexographic printing plates, also called circular printing plates, and so the printing cylinder is surrounded over its entire circumference with a printing layer. Cylindrical printing plates continue to possess great importance for the printing of continuous patterns such as wallpapers, decorative papers, or gift wrap, for example, and also for print orders requiring very high register accuracy.

Cylindrical flexographic printing plates customarily comprise a cylindrical, dimensionally stable base sleeve, or simply "sleeve", which has been provided with a print layer. For printing, in a manner known in principle, the cylindrical flexographic printing plates can be mounted onto air cylinders of the printing machine. Air cylinders are specialty printing cylinders which possess a compressed-air connection at the end face, allowing compressed air to be introduced into the inside of the cylinder. From there it can emerge again via holes arranged on the outside of the cylinder. For the mounting of a sleeve, compressed air is introduced into the air cylinder, and emerges again at the exit holes. The sleeve can now be pushed onto the air cylinder, since it expands slightly under the influence of the air cushion, and the air cushion significantly reduces friction. When the supply of compressed air is ended, the expansion is reversed and the sleeve sits firmly on the surface of the air cylinder. Further details relating to the sleeve technology are disclosed in "Technik des Flexodrucks" [Flexographic printing technology], p. 73 ff., Coating Verlag, St. Gallen, 1999, for example.

High-quality circular printing plates cannot be produced by simply enveloping a sleeve completely with a flexographic printing plate that has already been processed to a print-ready state. Oftentimes there remains at the mating ends of the printing plate a fine gap, which in the case of true continuous motifs or offset copies, always also intersects printing regions of the plate. This gap causes a clearly visible line in the printed image. In order to avoid this line, only nonprinting wells may be located at this point, and therefore it is not possible to print just any desired patterns. With this technology, moreover, there is a risk of the solvent present in the printing ink penetrating into the gap and causing detachment of the ends of the printing plate from the printing cylinder. This leads to even greater defects in the printed image. Even if the ends are stuck, clearly visible traces still remain in the printed image.

For the production of high-quality circular printing plates, therefore, it is necessary to provide the printing cylinder or a sleeve with a fully enveloping, relief-forming layer by means of suitable techniques. This can be done, for example, by coating from solution or by annular extrusion. Both techniques, however, are extremely complicated and therefore correspondingly expensive.

Circular, photopolymerizable flexographic printing elements are frequently manufactured by placing a photopolymerizable flexographic printing element in plate form onto a cylindrical base sleeve and then fusing the ends of the plate to one another by heating. The coated sleeve is subsequently ground and brought to tolerance. This is a time-consuming operation. Finally, a laser-ablatable mask layer (LAM layer) can be applied. Circular flexographic printing elements of this kind are therefore expensive and have long delivery times.

WO 2004/092841 proposes a method for producing cylindrical, photopolymerizable flexographic printing elements, in which the layer ends of a suitably cut-to-size flexographic printing element in plate form are joined by calendering, with heating to a temperature below the melting temperature, the cutting-to-size taking place by means not of a vertical cut but rather of a miter cut. There is no need for a grinding operation. However, very long calendering times are necessary in order to achieve satisfactory results.

U.S. Pat. No. 5,916,403 discloses a method in which a melt strand of a photopolymerizable material is applied to a sleeve, with calendering using one or more calenders. In order to achieve complete coating of the sleeve, the sleeve is rotated, and additionally moved in the axial direction, during calendering and during application of the melt strand. Accordingly, the photopolymerizable layer is applied in the form of a helical line. For this technique, an extremely costly and complicated apparatus is required. Moreover, as a result of the calendering of the melt strand, there may be air bubbles included in the layer, or there may be particulate material drawn into the layer. This has an adverse effect on the surface quality of the cylindrical flexographic printing elements fabricated, and the yield of the method is reduced.

It was an object of the invention to provide a method for producing flexographic printing elements, preferably photopolymerizable flexographic printing elements, that yields flexographic printing elements having a high surface quality, without any need for subsequent machining of the surface.

This object is achieved by means of a method according to the claims. Found accordingly has been a method for producing cylindrical flexographic printing elements at least comprising a cylindrical sleeve (3) and also a relief-forming layer, wherein the relief-forming layer is applied using an apparatus (V) which comprises at least the following components:

a mounting means (1) for rotatable mounting of the cylindrical sleeve (3),
a drive unit which allows the cylindrical sleeve (3) to be rotated about the longitudinal axis,
an application means (4) for areal application of a relief-forming material in liquid melt form to the cylindrical sleeve (3), and where the method comprises at least the following method steps:

(A) providing a melt of a relief-forming material,
(B) rotating the cylindrical sleeve (3) about the longitudinal axis,
(C) areally applying the relief-forming material in liquid melt form to the rotating cylindrical sleeve (3) by means of the means (4), with a layer of the relief-forming material forming on the cylindrical sleeve (3), with the proviso that during the coating operation the cylindrical sleeve completes at least two complete rotations, so that at least two layers of the relief-forming material are coated one onto the other.

INDEX OF THE FIGURES

FIG. 1 Diagrammatic representation of the method of the invention

Figure 2:
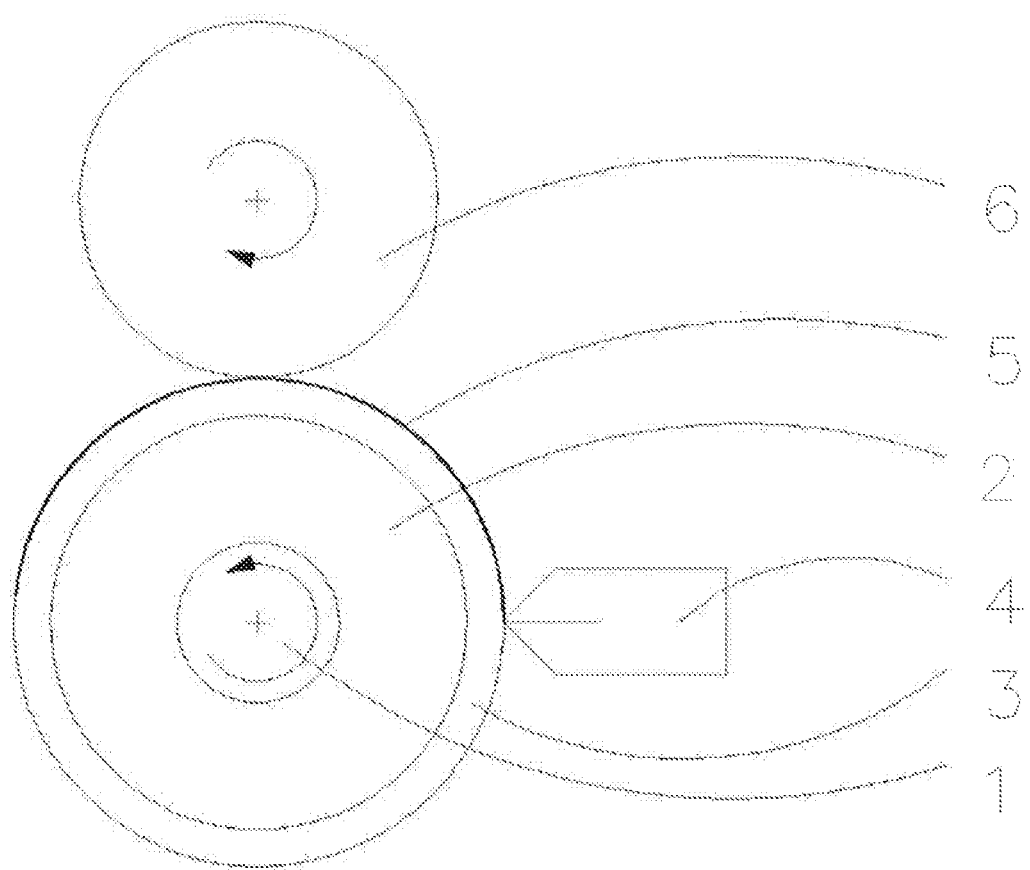
Figure 3:
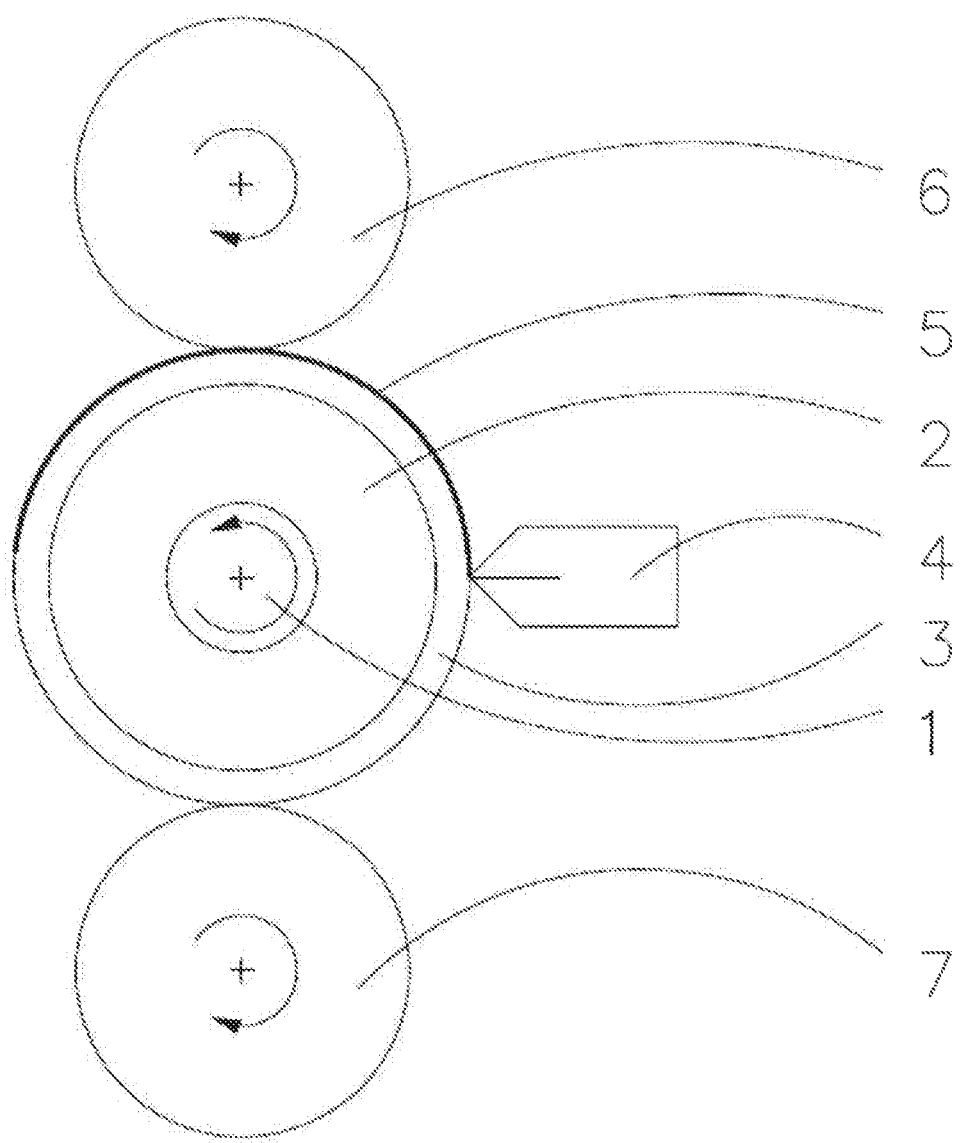
Figure 4:
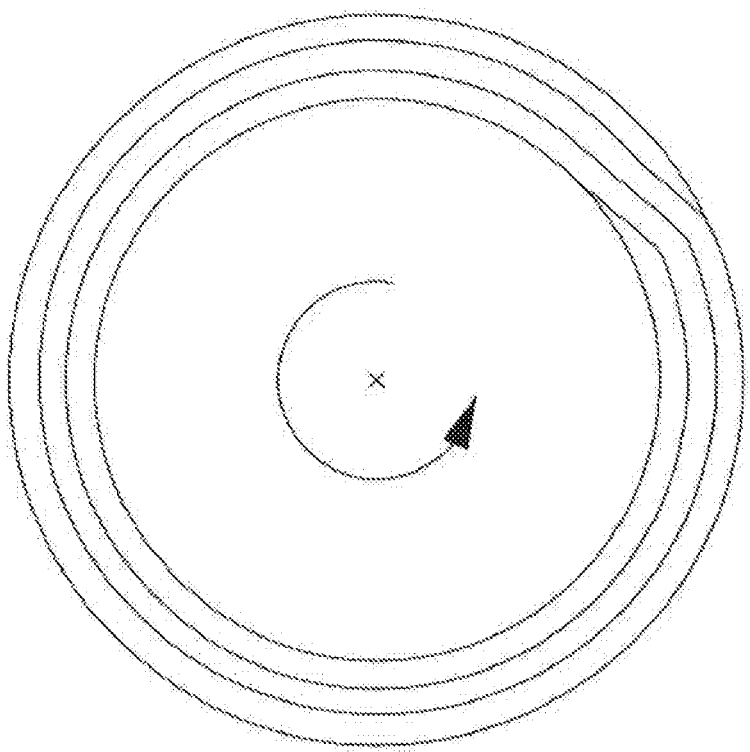

FIG. 2 Diagrammatic representation of one preferred embodiment of the method of the invention, using an apparatus with calender roll FIG. 3 Diagrammatic representation of one preferred embodiment of the method of the invention, using an apparatus with calender roll and additional cooling and/or support roll FIG. 4 Side view of a cylindrical sleeve coated with 3 layers of relief-forming material, including an ascending ramp when starting the coating and a descending ramp to finish the coating.

DETAILS OF THE INVENTION NOW FOLLOW

The cylindrical flexographic printing elements that are producible by means of the method of the invention comprise, in a manner known in principle, at least one cylindrical sleeve (3) and also a relief-forming layer. They may additionally comprise further layers.

The term "flexographic printing element" stands in a manner known in principle for a starting material which can be processed to form print-ready flexographic printing plates. Flexographic printing plates have an elastomeric layer provided with a print relief. Flexographic printing elements do not yet have a relief, instead having what is called a relief-forming layer, which can be processed to a print relief only in further steps. Suitable methods for producing flexographic printing plates from flexographic printing elements are known to the skilled person.

One preferred embodiment of the method concerns a photopolymerizable, relief-forming layer; further embodiments are described in the claims.

Construction of the Flexographic Printing Elements to be Produced

The cylindrical sleeve (3) serves as a base for the application of the relief-forming layer, preferably of the photopolymerizable relief-forming layer, and also, optionally, of further layers. These sleeves are available commercially in a multiplicity of embodiments. The length of the sleeve may be preferably 200 mm to 4000 mm and the diameter preferably 40 mm to 600 mm. Depending on the embodiment, the wall thickness may be 1 to 160 mm, for example. Suitable sleeves frequently have a multilayer construction and may comprise, for example, layers of polyester, polyacrylate, or epoxy resin, the layers being customarily reinforced with woven fibers or fiber mats.

In the case of photopolymerizable flexographic printing elements, preferred sleeves are transparent for UV light, allowing the photopolymerizable flexographic printing elements to be pre-exposed from the reverse before being processed into a circular flexographic printing plate.

The relief-forming layer may be applied directly to the cylindrical sleeve (3). In a further embodiment of the invention, one or more additional layers may be disposed between the cylindrical sleeve and the relief-forming layer. Examples of such layers include tie or bond layers, foam layers, or elastomeric underlayers.

The relief-forming layer is produced using thermoplastic materials. The composition of the relief-forming layer is guided by the intended processing of the flexographic printing element.

If processing by photopolymerization is intended, the cylindrical flexographic printing element comprises a photopolymerizable, relief-forming layer. Photopolmerizable layers can be imagewise-exposed. The unexposed portions of the layer are subsequently removed, using suitable solvents, for example. They may also be subjected to full-area exposure, after which a print relief can be engraved by lasers into the resulting elastomeric layer.

The photopolymerizable, relief-forming layer is preferably thermoplastic and it is possible in principle to use the customary thermoplastic compositions suitable for producing flexographic printing elements. Such compositions include thermoplastic-elastomeric binders, such as styrene-butadiene block copolymers, styrene-isoprene block copolymers, polybutadiene, ethylene-propylene-diene rubbers, or extrudable crude rubbers, for example, photoinitiators, crosslinkable components, and optionally other components.

In one preferred embodiment of the invention, the photopolymerizable, relief-forming layer comprises at least one thermoplastic-elastomeric block copolymer, at least one ethylenically unsaturated monomer, at least one photoinitiator, at least one plasticizer, and optionally other components.

The thermoplastic-elastomeric block copolymers comprise at least one block which consists essentially of alkenylaromatics, and at least one block which consists essentially of 1,3-dienes. The alkenylaromatics may be, for example, styrene, α-methylstyrene, or vinyltoluene. Styrene is preferable. The 1,3-dienes are preferably butadiene and/or isoprene. These block copolymers may be linear, branched, or radial block copolymers. Generally speaking, they are triblock copolymers of the A-B-A type, but they may also be diblock polymers of the A-B type, or may be polymers having a plurality of alternating elastomeric and thermoplastic blocks. A-B-A-B-A, for example. Mixtures of two or more different block copolymers may also be used. Commercial triblock copolymers frequently include certain fractions of diblock copolymers. The diene units may be 1,2- or 1,4-linked. Also possible for use, furthermore, are thermoplastic elastomeric block copolymers with styrene and blocks and a random styrene-butadiene middle block. Use may also be made, of course, of mixtures of two or more thermoplastic-elastomeric binders, provided that the properties of the relief-forming layer are not negatively impacted as a result.

As well as the stated thermoplastic-elastomeric block copolymers, the photopolymerizable layer may also comprise further elastomeric binders other than the block copolymers. With additional binders of this kind, also called secondary binders, the properties of the photopolymerizable layer can be modified. An example of a secondary binder are vinyltoluene-α-methylstyrene copolymers. Generally speaking, the amount of such secondary binders ought not to exceed 25 wt %, relative to the total amount of all binders used. The amount of such secondary binders preferably does not exceed 15 wt %, more preferably 10 wt %.

The total amount of binders is customarily 40 to 90 wt %, based on the sum of all constituents of the relief-forming layer, preferably 50 to 90 wt %, and more preferably 60 to 85 wt %.

The ethylenically unsaturated monomers used ought to be compatible with the binders, and they have at least one polymerizable, ethylenically unsaturated group. As monomers it is possible in particular to use esters or amides of acrylic acid or methacrylic acid with mono- or polyfunctional alcohols, amines, aminoalcohols or hydroxyethers and hydroxyesters, esters of fumaric acid or maleic acid, and allyl compounds. Esters of acrylic acid or methacrylic acid are preferred. Preference is given to 1,4-butanediol diacrylate, 1,6-hexanediol diacrylate, 1,6-hexanediol dimethacrylate, 1,9-nonanediol diacrylate, or trimethylolpropane tri(meth)acrylate. Mixtures of different monomers can of course be used.

The relief-forming layer preferably comprises—or includes as a building block—at least one ethylenically unsaturated monomer having two ethylenically unsaturated groups, more particularly 1,6-hexanediol diacrylate and/or 1,6-hexanediol dimethacrylate.

The total amount of all the monomers used in the relief-forming layer together is generally 1 to 20 wt %, preferably 5 to 20 wt %, based in each case on the sum of all the constituents of the relief-forming layer. The amount of monomers having two ethylenically unsaturated groups is preferably 5 to 20 wt %, based on the sum of all constituents of the relief-forming layer, more preferably 8 to 18 wt %.

Examples of suitable photoinitiators or photoinitiator systems include bezoin or benzoin derivatives, such as methylbenzoin or benzoin ethers, benzil derivatives, such as benzil ketals, acylarylphosphine oxides, acylarylphosphinic esters, polycyclic quinones, or benzophenones. The amount of photoinitiator in the relief-forming layer is generally 0.1 to 5 wt %, preferably 1 to 4 wt %, and more preferably 1.5 to 3 wt %, based on the amount (weight) of all constituents of the relief-forming layer.

Examples of plasticizers include paraffinic, naphthenic, or aromatic mineral oils, synthetic oligomers or resins such as oligostyrene, high-boiling esters, oligomeric styrene-butadiene copolymers, oligomeric α-methylstyrene/p-methylstyrene copolymers, liquid oligobutadienes, especially those having an average molecular weight of between 500 and 5000 g/mol, or liquid oligomeric acrylonitrile-butadiene copolymers or oligomeric ethylene-propylene-diene copolymers.

The amount of all plasticizers in the flexographic printing element is generally 1 to 40 wt % and preferably 1 to 20 wt %. The amount of the plasticizers is also guided by the particular binder system. In the case of plates based on a styrene-isoprene binder system, plasticizer quantities of 1 to 10 wt % have proven suitable. In the case of plates based on a styrene-butadiene binder system, plasticizer quantities of 20 to 40 wt % have proven suitable.

The photopolymerizable, relief-forming layer may further comprise typical additives and adjuvants. Examples of such adjuvants and additives include dyes, inhibitors for the thermal polymerization, fillers, or antioxidation. The skilled person selects according to the desired properties of the layer. Generally speaking, however, the amount of such adjuvants ought not to exceed 10 wt %, based on the amount of all components of the relief-forming layer, preferably 5 wt %.

The skilled person selects a suitable composition of the photopolymerizable, relief-forming layer according to the desired properties of the flexographic printing plate.

Flexographic printing elements to be processed to flexographic printing plates by laser engraving may also have a photopolymerizable relief-forming layer of the composition described. The layer in this case may also comprise additional fillers which do not disrupt photopolymerization with UV or UV/VIS radiation, such as finely divided silicon dioxide, for example.

However, for flexographic printing elements for laser engraving, relief-forming layers with a different composition are also suitable.

Where crosslinking is to take place not by UV or UV/VIS radiation, but instead with electron beams, there is no longer any need for the relief-forming layer to be optically transparent. In addition to the stated components, such flexographic printing elements may include dyes and/or fillers which strongly absorb the radiation from IR lasers in particular. The layer, for example, may comprise finely divided carbon black.

The relief-forming layers of flexographic printing elements intended for laser engraving need also not necessarily be crosslinked, but may instead comprise a suitable amount of fillers, as well as thermoplastic-elastomeric binders, in order to achieve a sufficient mechanical strength. Again, carbon black may be used as a filler for flexographic printing elements of this kind.

For the implementation of the method of the invention it has proven appropriate to use a thermoplastic material which in the melted state has a melt viscosity in the range from 10 Pas to 1000 Pas, preferably from 50 Pas to 200 Pas. The melt viscosity (determined by common methods) as measured at a defined temperature is of course dependent on the selected composition of the thermoplastic material. The viscosity may be adjusted to the desired viscosity by selection of a suitable temperature in the range from 80° C. to 180° C.

The cylindrical flexographic printing element may optionally have further layers on the relief-forming layer, more particularly on a photopolymerizable, relief-forming layer.

On photopolymerizable, relief-forming layers, for example, there may be transparent outer layers and/or barrier layers. Such layers may serve, for example, for disbonding from relief-forming, photopolymerizable layer, or to prevent or at least retard the penetration of atmospheric oxygen into the photopolymerizable layer. Layers of this kind may comprise, for example, elastomeric polyamides or semicrystalline polyvinyl alcohols.

Optionally, furthermore, photopolymerizable cylindrical flexographic printing elements may have a laser-ablatable mask layer. This layer may be disposed directly on the photopolymerizable, relief-forming layer. Between the laser-ablatable mask layer and the photopolymerizable, relief-forming layer, however, there may also optionally be further layers, as for example the aforementioned transparent outer layer or barrier layer. Laser-ablative mask layers are opaque to the wavelength of the actinic light, and customarily comprise a binder and also at least one IR absorber such as carbon black, for example. Carbon black also provides the layer with opacity. A mask can be written into the laser-ablatable layer using an IR laser—that is, at the areas at which it is struck by the laser beam, the layer is decomposed and eroded. Examples of imaging of flexographic printing elements with IR-ablative masks are disclosed in EP-A 0 654 150 or EP-A 1 069 475, for example.

Method of the Invention

The principle of the method of the invention is depicted diagrammatically in FIG. 1.

The method of the invention is performed using an apparatus (V) which is likewise a subject of the invention.

This apparatus comprises at least one mounting means (1) for rotatable mounting of the cylindrical sleeve (3). The mounting means may be, for example, a rotatably mounted mandrel. To perform the method, the cylindrical sleeve (3) may be mounted directly onto the mandrel. With advantage, however, it is also possible first to mount an adapter sleeve (3) onto the mandrel. With an adapter sleeve of this kind, the diameter of the mandrel can be enlarged in accordance with the diameter of the cylindrical sleeve (3). The adapter sleeves may be made of steel.

In order to realize a rapid changeover from one circumference to the next, and in order to make handling easier, it is also possible to use more lightweight PU/GRP adapters, of the kind which can also be used later in the printing machine. The cylindrical sleeve (3) for coating customarily has an internal diameter smaller than the external diameter of the adapter sleeve (2). This difference in dimension is customarily in the range <1 mm, and is also dependent on the absolute diameter of the sleeve. The cylindrical sleeve (3) can be pulled onto the adapter sleeve (2), by subjecting the adapter sleeve (2) to compressed air, in a manner known in principle, this air being able to flow out via fine openings in the surface of the adapter sleeve. Under the influence of this air cushion, the cylindrical sleeve (3) can be pulled onto the adapter sleeve (2). When the compressed air is shut off, the cylindrical sleeve (3) clamps firmly on the adapter sleeve (2).

The apparatus (V) further comprises a drive unit, which allows the mounting means along with the cylindrical sleeve (3) and also, where used, an adapter sleeve (2) to be rotated about the longitudinal axis.

The apparatus (V) used further comprises an application means (4) for areal application of a relief-forming material in liquid melt form to the cylindrical sleeve (3), and so a layer of the relief-forming material is formed on the sleeve. Preference is given to applying a relief-forming photopolymerizable material.

The apparatus (V) may also comprise two or more application means (4). Such an apparatus can be utilized in order to apply different materials in liquid melt form, one after the other.

The application means (4) may in principle be any kind of means suitable for the areal application of a material in liquid melt form, thus forming a layer of the material on the cylindrical sleeve (3). Examples of suitable application means (4) include slot dies, wide-slot dies, or multichannel slot dies. The coating unit may be attached vertically or at a different angle in relation to the surface of the cylindrical sleeve (3). Where an arrangement is chosen which is not horizontal or vertical, the arrangement in question is preferably at an angle between horizontal and vertical arrangement. As a general rule, the mounting of the application means (4) allows its distance from the cylindrical sleeve (3) to be varied.

It is advisable to use application means (4) which have a variable coating width. When application means of this kind are used, the apparatus (V) can, advantageously, be used to coat even sleeves of different length. An application means with variable coating width may be, for example, a multi-channel die whose individual channels can be engaged or disengaged separately, or it may be a slot die adjustable in width. The means (4) is preferably a slot die adjustable in width.

In one preferred embodiment of the invention it is advisable to keep the material in liquid melt form in the application means (4) in motion while the coating operation is not active. The material in liquid melt form may be kept in motion in a circuit, for example. In this way it is possible to prevent, for example, baked-on deposits and crosslinking reactions during an interruption in coating. Interruption may occur in particular when following complete coating of one sleeve, the coated sleeve is removed from the apparatus and a new, uncoated sleeve is installed for a new coating operation.

In accordance with the invention, the method comprises at least the method steps (A), (B), and (C) below that are described in the claims. Furthermore, it may also encompass further method steps.

In method step (A), a melt of a relief-forming material is provided. Suitable compositions of relief-forming materials have already been specified above. The material may preferably be a photopolymerizable, relief-forming material. The melt may be obtained, in a manner known in principle, by mixing the components with one another with heating.

The relief-forming material, preferably the photopolymerizable, relief-forming material, may be mixed and melted, in a manner known in principle, by means of a compounder, a single-screw extruder, or a twin-screw extruder, for example. The melt may optionally be degassed and conveyed to the application means (4).

In another embodiment of the method step (A), a mixture of a relief-forming material, already homogenized in a separate method step, may be melted and conveyed to the application means (4). This can be done by means of a heatable drum pump, for example.

In method step (B), the cylindrical sleeve (3), mounted indirectly or directly onto the rotatable mounting means (1), is rotated about the longitudinal axis by means of the drive unit of the apparatus (V). The speed of rotation is of course dependent on the circumference of the sleeve. The superficial velocity of the sleeve is customarily 1 cm/s to 10 cm/s.

In method step (C), the material in liquid melt form is applied areally onto the rotating cylindrical sleeve (3) by means of the means (4)—that is, a layer of the relief-forming material is formed on the sleeve (3). FIG. 1 shows the situation schematically after a half-rotation of the cylindrical sleeve (3). A layer (5) of the relief-forming material has formed on the surface of the sleeve. The cylindrical sleeve (3) is coated with the proviso that the cylindrical sleeve (3) performs at least two complete rotations during the coating operation. In this way, the layer of the relief-forming material becomes wound on the sleeve, and therefore at least two layers of the relief-forming material are coated one onto the other. The coating follows a spiral movement process. This is shown schematically in FIG. 4.

During the coating operation, the cylindrical sleeve (3) preferably performs at least three complete rotations, and so at least three layers of the photopolymerizable material are coated one onto another. The number of rotations and hence the number of layers laid down one over another may be 3 to 30 for example, preferably 5 to 20.

The temperature of the melt on application to the cylindrical sleeve (3) is of course guided by the nature of the relief-forming material used, preferably of the photopolymerizable, relief-forming material, and also by the desired viscosity of the melt, and is customarily between 80° C. and 160° C.

The distance of the application means (4) from the cylindrical sleeve (3) to be coated is preferably kept low and ought not to exceed a few mm. It should in general be 0 mm to 10 mm, preferably 0 mm to 4 mm, e.g., 0.01 mm to 4 mm. A distance of 0 mm means that the application means (4) may also be moved up to be in contact. In the case of this embodiment, it also acts as a smoothing tool for the layer.

It is advisable to keep constant the distance between the application means (4) and the most recently applied layer of the relief-forming material during coating, in order to achieve uniform coating conditions. Therefore, in view of the increasing diameter of the cylindrical flexographic printing element in the course of coating, it is advisable in one preferred embodiment to increase continuously the distance between the application means (4) and the cylindrical sleeve (3)—considered without its coating—during the coating operation, in line with the increasing total layer thickness. In order to avoid damaging the relief-forming layer, an increase in the distance ought to be ensured particularly when the application means (4) has been moved up to be in contact.

In one preferred embodiment of the invention, the apparatus (V) further comprises a heatable calender roll (6) which is disposed downstream of the application means (4) in the direction of rotation. This embodiment of the invention is shown schematically in FIG. 2. The layer (5) just applied is calendered using the calender roll (6). The calender, which runs in the same direction as the coating roll, is usually moved up to be in contact (kiss setting), and functions in a customary way as a smoothing tool for the applied layer Following the application of all desired layers and the halting of coating, it may be advisable to allow the calender to run on for a certain time, in order to obtain an optimum smoothing effect. In general the calender roll (6) is mounted in such away that its distance from the cylindrical sleeve (3) can be varied. In analogy to the application means, it is advisable to increase continuously the distance between the calender roll (6) and the cylindrical sleeve (3)—considered without its coating—during the coating operation, in line with the increasing total layer thickness.

The calender roll is preferably heated. The temperature is guided by the nature of the relief-forming, preferably photopolymerizable, material that is used. The calender roll temperature is preferably between 70° C. and 120° C.

The surface temperature of the applied layer ought not to exceed 80° C., preferably 70° C. and more preferably 60° C., before the next layer is applied to the layer applied beforehand. Of course, following application, the applied layer gradually cools down by itself. In order to ensure more rapid coating, therefore, it may be advisable to carry out active cooling of the applied coating—optionally after calendering—by means of suitable devices.

In a further preferred embodiment of the invention, therefore, the apparatus (V) further comprises at least one cooling means (7), downstream of the application means (4) and downstream—where present—of the calender roll (6) in the direction of rotation, in order to cool the layer.

In one embodiment of the invention at least one of the cooling means (7) is a rotatably mounted, unheated roll. An embodiment of the invention in this way is depicted schematically in FIG. 3. Here as well it is advisable to increase continuously the distance between such a cooling roll and the cylindrical sleeve (3)—considered without its coating— during the coating operation, in line with the increasing total layer thickness.

In a further embodiment of the invention, at least one of the cooling means (7) is a means which allows a stream of air to be blown onto the applied layer. The means in question may comprise, for example, nozzles with which air can be blown onto the layer.

Particular advantage attaches to an embodiment of the invention wherein cooling means (7) present comprise at least one rotatably mounted, unheated roll and a means with which a stream of air can be blown onto the applied layer.

The thickness of the applied individual layers of relief-forming material is generally 0.05 mm to 0.3 mm, preferably 0.1 to 0.25 mm.

The total thickness of the relief-forming layer is generally 0.3 mm to 10 mm, often 0.4 mm to 10 mm.

In order to ensure particularly high quality on the part of the cylindrical flexographic printing elements, a series of further measures has proven suitable.

As a general rule it is advisable not to change the speed of the cylindrical sleeve during the coating operation. In one preferred embodiment of the invention, therefore, it has proven appropriate to increase continuously the amount of the relief-forming material in liquid melt form that is applied per unit time in the course of coating. This measure can be used to take account of the increase in the amount of material required on the basis of the increasing diameter of the coated sleeve on each rotation. The skilled person is easily able to calculate the extra requirement per rotation. In this way, a uniform thickness of the layers to be applied is ensured, and the thickness tolerances are minimized.

In a further preferred embodiment of the invention, coating is commenced with an ascending ramp (the flow of material is increased) and coating is ended with a descending ramp (the flow of material is reduced). In this way, the desired layer thickness is not achieved immediately on startup; instead, the layer thickness is increased slowly to the desired level, and, on shutdown, coating is not halted abruptly, the layer thickness instead being slowly reduced. The ascending ramp and the descending ramp ought here to lie one over the other. In this way, sharp discontinuities in layer thickness as a result of startup and shutdown can be compensated, and the thickness tolerances of the cylindrical flexographic printing element can therefore be minimized.

FIG. 4 shows schematically a side view of a coated sleeve with an ascending ramp at the beginning of coating and a descending ramp at the end of coating, with the ascending and descending ramps lying one over the other. The length of a ramp may be determined by the skilled person; approximately 1/30 to 1/60 of a rotation has proven appropriate for the ramp.

The method described can be used to coat a cylindrical sleeve (3) in its entire length. It is of course possible not to coat the entire length, so leaving uncoated regions at the ends of the sleeve. It is possible, moreover, to apply a plurality of separate areal layers to the cylindrical sleeve. In this way it is possible to save on material if, for example, separate copies are to be printed alongside one another. For the latter embodiment, a particularly suitable application means (4) is a multichannel die whose individual channels are each separately regulated.

In a further embodiment of the invention, two or more liquid-melt materials of different compositions may be applied during the coating of the cylindrical sleeve. For this purpose, an apparatus (V) ought to be used which comprises two or more application means (4), with each of the materials being applied by means of a particular application means. In this way it is possible to obtain a flexographic printing element which comprises two or more different layers, preferably two different layers. The term "layer" in this context refers to the macroscopic construction of the flexographic printing element. Each of these layers may be obtained by applying a plurality of individual layers by means of the method of the invention. The changeover from one relief-forming material in liquid melt form to the next may take place in principle at any time, though it is preferred to carry out the changeover only after complete rotations of the sleeve in each case.

The apparatus used in accordance with the invention may further comprise additional modules with which individual layers already applied can be modified physically. It is also possible in this way to achieve a multilayer construction.

Individual photopolymerizable layers that have already been applied may be crosslinked, for example, by UV or UV/VIS radiation (by means of UVA-LEDs, for example). Irradiation may be stopped on further coating. In this way it is possible to obtain a cylindrical, photopolymerizable flexographic printing element which has a two-layer construction composed of a polymerized, elastomeric underlayer and a photopolymerizable, relief-forming top layer. Where a photopolymerizable flexographic printing element of this kind is used for producing flexographic printing plates, there is no need, advantageously, for the reverse exposure, which is technically difficult with cylindrical, photopolymerizable flexographic printing elements.

In an analogous way, crosslinking may also take place by means of electron beams—the application of electron beams is not confined to photopolymerizable layers; instead, for example, layers which are opaque to UV/VIS radiation may also be crosslinked by means of electron beams.

Prior to coating with the relief-forming material in liquid melt form, it is optionally possible for further layers to be applied to the cylindrical sleeve (3), examples being bond layers or tie layers. Such layers may have been applied in a separate step, or the apparatus for use in accordance with the invention may comprise additional assemblies for applying such layers.

In the method of the invention, when the layers of relief-forming material in liquid melt form, preferably of the photopolymerizable material, are placed one atop another, there are surprisingly no bubbles or other irregularities produced. The startup or shutdown of the coating installation as well leaves no visible traces at all behind in the end product. The method of the invention furnishes absolutely defect-free, cylindrical flexographic printing elements with precise tolerances and an outstanding surface. There is no need for subsequent grinding or polishing of the surface.

Application of Further Layers

In further method steps, the cylindrical flexographic printing elements obtained may be provided with further layers. Photopolymerizable, cylindrical flexographic printing elements may be provided in particular with transparent outer layers or barrier layers and/or laser-ablatable mask layers. Suitable compositions of these layers have already been referred to above. Laser-ablatable mask layers, for example, may be applied in a manner known in principle, by means of spray coating or roller coating.

Processing to Give Flexographic Printing Plates

The cylindrical flexographic printing elements obtained by means of the method can be processed further, in a manner known in principle, to form flexographic printing plates, which are likewise a subject of the invention. The way in which the flexographic printing elements are processed further is guided by the nature of the relief-forming layer.

In the case of cylindrical photopolymerizable flexographic printing elements which have a laser-ablatable mask layer, the mask layer may first be imaged in a manner known in principle by means of a laser, more particularly an IR laser, meaning that the mask layer is eroded at those areas at which it is struck by the laser beam. The photopolymerizable layer may then be imagewise-exposed with actinic light, especially UV or UV-VIS radiation. The remnants of the mask layer and also those parts of the layer that have remained unexposed may subsequently be removed in a suitable way. This can be done, for example, by washing using suitable solvents or solvent mixtures. Alternatively the unexposed portions may also be removed thermally, by contacting the layer with an absorbent material, such as a nonwoven web, for example, and heating the layer. The portions of the layer that have softened under the influence of temperature are drawn up by the absorbent material and can be taken off together With the absorbent material. The removal of the unexposed portions may be followed by a customary posttreatment, such as irradiation with UV-C light. The final product is a cylindrical flexographic printing plate which can be used for printing.

Photopolymerizable flexographic printing elements may also be processed to give flexographic printing plates by means of laser engraving. For this purpose, the photopolymerizable, relief-forming layer is subjected not to imagewise exposure but rather to full-area exposure with actinic light, especially UV or UV-VIS radiation. Using a laser, more particularly an IR laser, a relief may then be engraved into the fully crosslinked layer.

Instead of UV or UV-VIS radiation, electron beams can also be used for full-area crosslinking. Electron beams can be used advantageously for crosslinking when the relief-forming layer no longer has sufficient transparency for UV or UV/VIS radiation, owing to the presence of carbon black, for example.

Flexographic printing elements which have been reinforced mechanically using fillers can be engraved with a relief, by laser engraving, directly after production.

Flexographic printing elements produced by laser engraving may optionally be posttreated using known techniques. For example, the freshly engraved layer may be posttreated using suitable liquid cleaning formulations.

The examples which follow are intended to illustrate the invention in more detail:

Determination of the Concentricity:

The concentricity was determined using a Keyence light-band micrometer, and is a measure of the maximum deviation in the height profile of the sleeve from the ideal circular form. The deviations from the circular form are measured at 5 locations along the coated sleeve, and the absolute deviation in $\mu m$ was ascertained.

Example 1: Application of 7 Layers One Over Another

The apparatus used for coating comprises a rotatable core driven by a drive means. The application means of the apparatus comprises a multichannel die 50 cm wide, with 20 separate channels, the flow through which can be controlled by means of a gear pump in each case. An individual channel has a coating width of 25 mm. The dies additionally have a start up valve through which material conveyed into the die can be discharged prior to startup, for example, in order to assess the quality. Furthermore, the apparatus comprises a calender roll which is disposed downstream of the multichannel die in the direction of rotation.

A steel adapter 168.82 mm in diameter was pulled onto the core of the unit. A base sleeve (Rotec® Photolight) with a wall thickness of 0.68 mm, an external diameter of 170.18 mm, and a length of 650 mm was pulled onto the steel adapter by means of compressed air.

Coating took place using a photopolymerizable material having the following composition:

| | |
|---|---|
| Styrene-butadiene-styrene block rubber (Kraton ® 1102) | 59 parts |
| Hexanediol diacrylate | 10 parts |
| Benzil dimethyl ketal | 2 parts |
| Kerobit TBK stabilizer (manufacturer: BASF) | 1 part |
| Polybutadiene oils | 28 parts |

Kraton® 1102 is a commercial linear S/B block copolymer (manufacturer: Kraton Polymers). The components were melted in a ZSK 30 twin-screw extruder at 130° C. to 150° C., filtered, and degassed. The throughput of the extruder was adjusted such that sufficient material was available for the gear pumps in the die.

The melt temperature in the die was 160° C. Only when the melt emerged homogeneously ahead of the die from the start up valve, the startup valve was closed and coating was commenced. Die and calender were moved into position. The calender temperature was 90° C. Coating was commenced with a volume flow rate of 6.63 l/h and increased—owing to the increasing diameter—to 6.72 l/h by the end of coating. The rotary speed of the carrier roll was 2.33 rpm. The thickness of an applied layer was 177 μm. The total duration of coating was 3 minutes. The total application thickness after coating had taken place was 1.24 mm (7 layers of 177 μm). A time span of 3 seconds was set for the startup and shutdown ramps.

Each individual layer was calendered during the coating operation. The calender in this case was operated in kiss print setting each time. Downstream of the calender roll in the direction of rotation, the layer was blown using air nozzles, before the next layer was applied. After the end of coating, smoothing took place for an additional 2 minutes, followed by a further 2 minutes of cooling.

The coated sleeve was removed from the adapter and had a perfect, uniform surface. There were no bubbles apparent at all. The concentricity was 17 μm.

Comparative Example 1: Application of a Single Layer with Gap

The throughput of the extruder was increased (25 kg/h), providing sufficient melt material at the die to apply a single photopolymerizable layer 1.24 mm thick to the base sleeve. The melt temperature in the die was 163° C.

The dimensions of the steel adapter and the dimensions of the base sleeve were as in example 1.

Die and calender were moved into position. Coating was commenced with a volume flow rate of 19.89 l/h. The rotary speed of the carrier roll was reduced to 1 rpm. Coating was controlled so that there was a gap approximately 1 mm in size between the start of coating and the end of coating.

In order to close the gap, the layer was calendered directly after application (without air cooling). The temperature of the calender was 120° C. The calender was operated with a print setting of 60 μm. After a calendering time of 10 minutes, the gap had closed macroscopically.

The coated sleeve was cooled and removed. The gap had indeed closed. However, there were numerous air bubbles (38 bubbles) enclosed within the gap. The concentricity was inadequate. It was 63 μm.

Comparative Example 2: Application of a Single Layer without Gap

The comparative example was repeated. The layer was again applied with an initial flow rate of 19.89 l/h at a rotary speed of 1 rpm. In order to avoid a gap, the coating was commenced and ended with a startup ramp and shutdown ramp lasting 3 seconds. The thickness of the layer was again 1.24 mm.

Directly after application, the layer was calendered. The calender was operated with a setting of 30 μm. The calender temperature was 90° C. After 5 minutes of calendering, the sleeve was removed. The surface was flawless and showed no bubbles at all. However, the concentricity was inadequate. It was 45 μm.

The invention claimed is:

1. A method for producing cylindrical flexographic printing elements comprising a cylindrical sleeve and a relief-forming layer, wherein the relief-forming layer is applied using an apparatus which comprises at least the following components:
    a mounting means for rotatable mounting of the cylindrical sleeve,
    a drive unit which allows the cylindrical sleeve to be rotated about a longitudinal axis of the cylindrical sleeve,
    an application means for areal application of a relief-forming material in liquid melt form to the cylindrical sleeve,
and in that the method comprises at least the following method steps:
    (A) providing a melt of a relief-forming material,
    (B) rotating the cylindrical sleeve about the longitudinal axis,
    (C) areally applying the relief-forming material in liquid melt form to the rotating cylindrical sleeve in order to form the relief-forming layer as a superposition of a plurality of layers comprising at least a first layer and a second layer by means of the application means, said applying comprising the steps of:
        forming the first layer by applying the relief-forming material on the cylindrical sleeve during a first complete rotation of the cylindrical sleeve,
        forming the second layer on the first layer by applying the relief-forming material during a second complete rotation of the cylindrical sleeve,
wherein a distance between the application means and the cylindrical sleeve is increased during the step of areally applying of relief material such that a distance between the application means and said first layer during the step of forming of said first layer and a distance between the application means and said second layer during the step of forming of the second layer and a distance between the application means and any further layers of the plurality of layers during a step of forming the further layers is kept constant.

2. The method of claim 1, wherein the apparatus further comprises a heatable calender roll, disposed downstream of the application means in the direction of rotation, and an applied layer is calendered.

3. The method of claim 1, wherein the apparatus further comprises at least one cooling means for cooling an applied layer, said cooling means being disposed downstream of the application means in the direction of rotation.

4. The method of claim 3, wherein at least one of the cooling means is a means by which a stream of air can be blown onto the applied layer.

5. The method of claim 3, wherein the at least one of the cooling means is a rotatable mounted, unheated roll.

6. The method of claim 1, wherein the application means is a slot die adjustable in width.

7. The method of claim 1, wherein the thickness of each of the first and second layers of relief-forming material is 0.05 mm to 0.3 mm.

8. The method of claim 1, wherein the combined layer thickness of all of the superposition of the plurality of layers forming the relief-forming layer is 0.3 mm to 10 mm.

9. The method of claim 1, wherein step (A) is performed by mixing components of the relief-forming material using an extruder or compounder and melting the mixture, the melt being optionally degassed and conveyed to the application means.

10. The method of claim 1, wherein during step (C) the cylindrical base sleeve completes at least three complete rotations, so that at least 3 layers of the relief-forming material are coated one onto another.

11. The method of claim 1, wherein at least two different materials in liquid melt form are applied in succession.

12. The method of claim 1, wherein the relief-forming layer is a photopolymerizable relief-forming layer and in the course of the method a photopolymerizable material in liquid melt form is applied.

13. The method of claim 1, wherein application of the relief-forming layer is preceded by application to the cylindrical sleeve first of a tie, a bond, or foam layer or of an elastomeric underlayer.

14. The method of claim 1, wherein the apparatus further comprises an additional module with which layers already applied can be physically modified.

15. The method of claim 14, wherein the additional module is a means for irradiating applied layers with electron beams, and relief-forming layers already applied are subjected to full-area crosslinking.

16. The method of claim 14, wherein the additional module is a means for irradiating applied layers with UV or UV/VIS radiation, and photopolymerizable layers already applied are subjected to full-area crosslinking.

17. The method of claim 12, wherein application of a photopolymerizable, relief-forming layer is followed in a further method step by application additionally of a transparent outer layer or barrier layer to the photopolymerizable, relief-forming layer.

18. The method of claim 12, wherein application of a photopolymerizable, relief-forming layer is followed in a further method step by application of a laser-ablatable mask layer to the photopolymerizable, relief-forming layer or—where present—to a transparent outer layer or barrier layer.

* * * * *